United States Patent [19]

Petroff et al.

[11] Patent Number: 4,568,960
[45] Date of Patent: Feb. 4, 1986

[54] BLOCKED IMPURITY BAND DETECTORS

[75] Inventors: Michael D. Petroff, Fullerton; Maryn G. Stapelbroek, Santa Ana, both of Calif.

[73] Assignee: Rockwell International Corporation, El Segundo, Calif.

[21] Appl. No.: 199,881

[22] Filed: Oct. 23, 1980

[51] Int. Cl.$^4$ .................. H01L 31/06; H01L 31/18; H01L 27/14
[52] U.S. Cl. .......................................... 357/30; 357/58
[58] Field of Search .................. 250/339, 370; 357/24, 357/30, 31, 90, 4, 58

[56] References Cited

U.S. PATENT DOCUMENTS

| | | | |
|---|---|---|---|
| 4,176,369 | 11/1979 | Nelson et al. | 357/24 |
| 4,236,829 | 12/1980 | Chikamura et al. | 357/31 |
| 4,247,862 | 1/1981 | Klein | 357/24 |
| 4,266,235 | 5/1981 | Herbst et al. | 357/24 |
| 4,276,099 | 6/1981 | Keen et al. | 357/30 |
| 4,287,383 | 9/1981 | Peterson | 357/30 |
| 4,313,127 | 1/1982 | Su et al. | 357/30 |

OTHER PUBLICATIONS

Petroff et al, "Low Level Radiation Effects in Extrinsic Infrared Detectors", 7/79, pp. 4840–4846, IEEE Annual Conference on Nuclear and Space Radiation Effects, portions printed in IEEE Trans. Nucl. Sci. (USA), vol. NS26, #6.

P. R. Bratt, Impurity Germanium and Silicon Infrared Detectors, in vol. 12, Semiconductors and Semimetals, pp. 85–90 (R. K. Willardson, Ed. 1977).

A. L. Efros et al., Impurity Conductivity in Low Compensated Semiconductors, 50 Phys. Stat. Sol. (b) 45 (1972).

N. F. Mott et al., The Theory of Impurity Conduction, 10 Advances in Physics, 110–116 (1961).

*Primary Examiner*—Nelson Moskowitz
*Attorney, Agent, or Firm*—H. Fredrick Hamann; Craig O. Malin; John J. Deinken

[57] ABSTRACT

Disclosed is a blocked-impurity-band detector, including an active layer which is doped with a sufficient amount of either a donor or an acceptor impurity that significant charge transport can occur in an impurity band in addition to the charge transport of electrons in the conduction band of the layer and of holes in the valence band of the layer. A blocking layer is disposed on the active layer and contains a sufficiently low concentration of impurities that significant charge transport cannot occur in the blocking layer except by means of electrons in the conduction band of the layer or holes in the valence band of the layer. First and second electrodes are provided for applying a bias potential across the active and blocking layers.

25 Claims, 10 Drawing Figures

BLOCKED IMPURITY BAND DETECTORS

BACKGROUND OF THE INVENTION

This invention relates to the field of electro-optics and, more particularly, to optical detectors.

Optical detectors are of considerable importance in a number of areas of technology, particularly those detectors which operate in the infrared response range. The implementation of national missile defense and space surveillance programs, for example, has created a requirement for detection and imaging systems operating in the medium and long wavelength infrared spectral ranges. Furthermore, the performance criteria established for the parameters of resolution and field of view in these programs have led to the development of high density, large area arrays of long wavelength infrared (LWIR) and medium wavelength infrared (MWIR) detectors. Monolithic extrinsic silicon detector arrays appear to be ideally suited for such applications, since large scale integration (LSI) techniques, which have been extensively developed for silicon, can be combined with extrinsic silicon detector technology to fabricate a monolithic silicon focal plane. An additional constraint is imposed on the selection of the detector elements in such a system, however, since these systems frequently must operate in the presence of nuclear radiation. Nuclear radiation induced ionization pulses (spikes) at the detector output can introduce an added noise component which will reduce the capability of such a system to detect faint targets and will add to the burden of reliably interpreting the focal plane output. Although such nuclear radiation induced noise can be reduced by decreasing the thickness of the detectors, it has been demonstrated that extrinsic silicon detectors cannot be fabricated in the conventional photoconductor configuration with a thickness much less than approximately 100 microns ($\mu$m) without sacrificing detector performance. Thin detector performance would be degraded because the high doping levels which would be required in a thinner detector to maintain a high quantum efficiency would result in unacceptable dark current levels due to "impurity banding" effects. See, e.g., P. R. Bratt, "Impurity Germanium and Silicon Infrared Detectors" in Semiconductors and Semimetals, Vol. 12, p. 89 (Academic Press 1977). This thickness limitation also adversely affects the level of optical cross talk which can occur between the detectors in an array. In addition, the thickness parameter prevents the use of epitaxial manufacturing approaches, although this consideration is not of primary importance. Furthermore, the performance of conventional extrinsic silicon detectors is degraded at low background levels by a number of response "anomalies" which make detector calibration difficult.

These limitations of conventional detectors in the infrared region are illustrative of difficulties experienced as well with nonsilicon detectors and detectors sensitive within other portions of the spectrum. Consequently, a need has developed in the art for an improved thin detector design.

SUMMARY OF THE INVENTION

It is a general objective of this invention to provide an improved optical detector.

The blocked-impurity-band detector of this invention includes an active layer doped with a sufficient amount of an impurity that charge transport can occur in an impurity band in addition to the charge transport of electrons in the conduction band of the layer or holes in the valence band of the layer. A blocking layer is disposed on the active layer and contains a sufficiently low concentration of impurities that significant charge transport cannot occur in the layer except by means of electrons in the conduction band of the layer or holes in the valence band of the layer. First and second electrodes are provided for applying a bias potential across the layers.

In a more particular embodiment, the blocked impurity band detector of this invention includes a relatively heavily doped active layer of a first conductivity type on which is grown an intrinsic, undoped blocking layer. First and second electrodes are included for applying a bias potential across the active and blocking layers.

In more detailed embodiments, the active and blocking layers may be comprised of silicon, while the active layer may be made responsive to light in the infrared portion of the spectrum. The active layer of the detector may be doped with a donor impurity, so that the layer exhibits an n-type conductivity, or with an acceptor impurity, so that the layer exhibits a p-type conductivity.

A number of other configurations are within the scope of this invention. The detector, for example, may include a degenerately doped substrate of a first conductivity type, with a relatively heavily doped active layer of the first conductivity type disposed on the substrate. A blocking layer, no more than lightly doped, is disposed on the active layer, and a transparent electrode implanted into the blocking layer.

In another alternative embodiment, the detector includes a substrate, no more than lightly doped, a relatively heavily doped active layer of a first conductivity type disposed on the substrate, a transparent first electrode disposed between the substrate and the active layer, a blocking layer, no more than lightly doped, disposed on the active layer, and a second electrode implanted into the blocking layer.

A third alternative detector embodiment includes a relatively heavily doped active layer of a first conductivity type, a first electrode implanted into the active layer, and a blocking layer, no more than lightly doped, disposed on the active layer opposite the first electrode. A transparent second electrode is implanted into the blocking layer.

In another configuration, the detector may include a degenerately doped substrate of a first conductivity type on which is disposed a blocking layer, no more than lightly doped, while a relatively heavily doped active layer of the first conductivity type is disposed on the blocking layer. This detector is completed by a transparent electrode implanted into the active layer.

Another variation includes a substrate, no more than lightly doped, and a blocking layer, also no more than lightly doped, which is disposed on the substrate, with a transparent first electrode disposed between the substrate and the blocking layer. A relatively heavily doped active layer of a first conductivity type is disposed on the blocking layer, with a second electrode implanted into the active layer.

The invention also encompasses a method of making a blocked impurity band detector, including the steps of:

(a) providing a degenerately doped substrate of a first conductivity type, (b) epitaxially growing a thin active layer on the substrate, (c) selectively heavily doping the active layer to the first conductivity type, (d) epitaxially growing a thin intrinsic blocking layer on the active layer, and (e) implanting a transparent electrode in the blocking layer.

In a more particular embodiment, the method further includes the steps of thinning the blocking layer in a region, doping the thinned region with an ion implantation of the first conductivity type, and heavily doping a contact region in the blocking layer and adjacent to the thinned region with an ion implantation of the first conductivity type.

These examples summarize some of the more important features of this invention in order to facilitate an understanding of the detailed description which follows and so that the contributions which this invention provides to the art may be better appreciated. There are, of course, additional features of the invention, which will be further described below and which are included within the subject matter of the appended claims.

BRIEF DESCRIPTION OF THE DRAWINGS

An understanding of additional objectives, features, and advantages of the present invention may be obtained by reference to the description of the preferred embodiments in conjunction with the accompanying drawings, wherein the same numbers are used to refer to like elements throughout all the figures. In the drawings.

DESCRIPTION OF THE PREFERRED EMBODIMENTS

Figure 1:
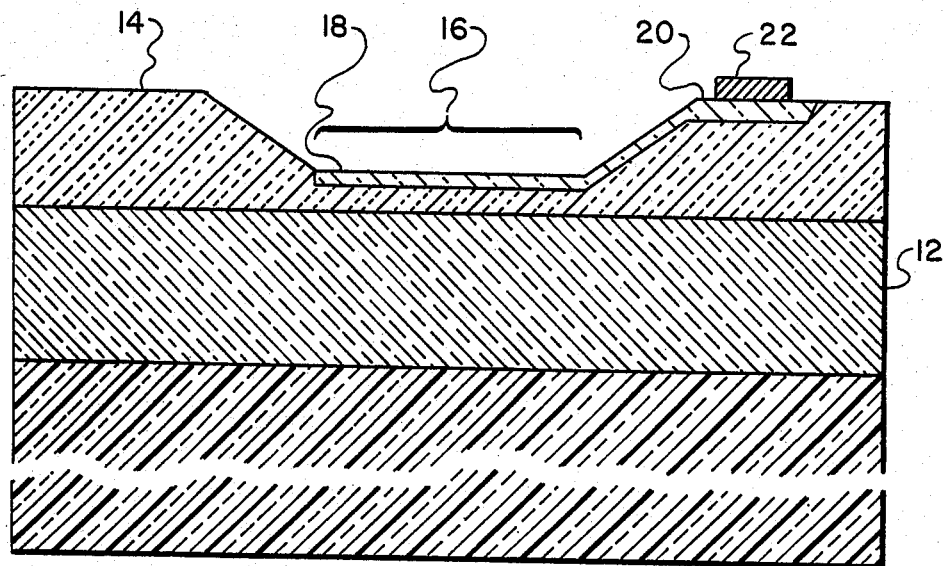
FIG. 1 is a sectional side view of an As doped silicon detector constructed according to the present invention for responding to infrared radiation.

The present invention establishes a new approach in making a thin photoconductive detector. Because this concept is quite different from the conventional approaches of the prior art, it is important to preface the discussion of the preferred embodiments with an explanation of the meaning of several terms which are closely associated with the operational concept of this invention.

The term "impurity band" refers to a collection of energy levels which are contained within a forbidden energy gap or band gap of a semiconductor material. Where certain impurities or defects are present in the semiconductor material at sufficiently high concentrations, charge transport can occur in the material between these energy levels without the necessity of exciting the charge carriers to the valence or conduction bands of the material. Such an impurity band need not necessarily be made up of true "band like" or extended energy states, but can consist of states which are localized on impurities or defects within the material. In the latter case, charge transport can occur by means of a hopping or tunnelling type of motion between the impurity or defect sites.

Several conductivity classes for semiconductor materials may be distinguished depending upon the types of charge transfer which can occur within a material. Where the material is undoped (i.e., intrinsic) or doped only minimally, the concentration of donor or acceptor impurities or defects will be low enough that significant charge transport cannot occur except by virtue of electrons in the conduction band of the material (n-type conductivity) or holes in the valence band of the material (p-type conductivity).

Where the semiconductor material is doped to a higher concentration with impurities or defects acting as donors or acceptors, significant charge transport can occur in an impurity band separated in energy from the conduction band and the valence band, this charge transport acting in addition to the charge transport caused by electrons in the conduction band or holes in the valence band.

A third class of conductivity can occur where the semiconductor material contains a sufficiently high concentration of impurities or defects, either donors or acceptors, that it exhibits degenerate or "metallic" conductivity.

The effects which give rise to these conductivity classes are known in the art. See, e.g., N. F. Mott and W. D. Twose, "The Theory of Impurity Conduction", Advances in Physics, Vol. 10, pp. 111-12 (1961); A. L. Efros, et al., "Impurity Conductivity in Low Compensated Semiconductors", Phys. Stat. Sol.(b) Vol. 50, pp. 45-52 (1972). The teachings of these publications are incorporated herein by reference. Also useful for the present discussion are the conventional terms "first conductivity type" and "second conductivity type", which are used in the art to distinguish between different types of conductivity such as, for example, that of a donor (n-type) impurity-containing material and that of an acceptor (p-type) impurity-containing material.

Illustrated in FIG. 1 in a sectional side view is an arsenic (As) doped silicon detector constructed according to the present invention for responding to infrared radiation. Those skilled in the art will appreciate, of course, that the inventive concept is not limited either as to these particular materials or to detection in the infrared region of the spectrum. The blocked impurity band (BIB) detector illustrated in FIG. 1 includes an n-type substrate 10, which is doped with a donor impurity to a sufficiently high concentration ($N_D \gtrsim 5 \times 10^{18}$ cm$^{-3}$) that the substrate exhibits degenerate conductivity. A thin, relatively heavily doped n-type active layer 12 is epitaxially grown on the substrate 10. The active layer is doped to a concentration $N_D$ of approximately $7 \times 10^{17}$ cm$^{-3}$, so that significant charge transport can occur either in an impurity band or in the conduction or valence bands. A blocking layer 14, which is doped to a concentration $N_D < 5 \times 10^{14}$ cm$^{-3}$, is epitaxially grown on the active layer. With this minimal amount of doping, the concentration of impurities and defects in the blocking layer is sufficiently low that significant charge transport can occur in the blocking layer only through electrons in the conduction band or holes in the valence band of the material.

In one particular embodiment which has been fabricated, the active layer 12 was deposited to a thickness of approximately 6-10 $\mu$m and the blocking layer 14 was deposited with a thickness of approximately 4-8 $\mu$m. The blocking layer 14 was then selectively thinned to approximately 1-4 $\mu$m to form the active area 16 of the device. These dimensions are only illustrative, however, and may be varied to obtain the quantum efficiency which is required in a particular application. A shallow n+ ion implant is used to form a transparent contact 18 over the etched area, while the raised edges around the active area of the device permit the use of a heavier n++ implant 20 for coupling the contact 18 to an electrode 22 while avoiding a potential leakage path through the thinned portion of the intrinsic blocking layer 14. The BIB detector of FIG. 1 is designed for operation with a positive bias applied to the transparent contact 18 (through the electrode 22) relative to the substrate 10, and at temperatures where the thermal generation of free charge carriers is negligible.

The method of operation of the BIB detector is as follows. Even though the infrared active layer 12 is doped heavily n-type, a small residual concentration of compensating acceptor impurities will nevertheless be present. At low temperatures, under conditions of thermal equilibrium, these residual acceptor impurities will all be ionized. The condition of overall charge neutrality therefore requires the presence of an equal concentration of ionized donors (D+ charges). Because of the heavy doping which is applied to the active layer, the separation between these donor sites is small and the charge associated with an ionized donor is thus able to migrate, by a hopping motion, from one donor site to another within the active layer, an effect which is noted in the Mott and Efros references cited above. This effect occurs as a consequence of electrons tunneling from near neighbor neutral donors to an ionized donor, the net result being that the D+ charge moves in a direction opposite to that of electron movement. The time required for such tunneling is a strong function of the inter-donor distance. Calculated tunneling times, for example, are shorter than 0.1 ns for a distance of less than 100 Å and longer than seconds for a distance greater than 300 Å in As-doped silicon. Because of this effect, the D+ charges in the infrared active layer are rendered mobile and are able to transport charge without the necessity of promoting an electron to the conduction band, the transport of D+ charge occurring instead in an "impurity band."

By comparison, the average inter-donor distance in the nearly intrinsic blocking layer 14 is greater than 500 Å. The D+ charges, therefore, are not mobile in the blocking layer and the impurity band will thus be effectively blocked by this layer. Note that the blocking layer, however, does not impede the motion of electrons which are in the conduction band, but affects only the D+ charge transport.

With no infrared radiation incident on the detector, the application of a positive bias on the transparent contact 16 will sweep the pre-existing D+ charges in the active layer toward the substrate, while the blocking layer will prevent the injection of new D+ charges. A region depleted of D+ charges will thus be created, the width of this depletion region depending on the applied bias and on the residual acceptor concentration. Since the ionized acceptors are not mobile, a negative space charge will remain in the depletion region, with the electric field decreasing as it penetrates into the infrared active layer in accordance with Poisson's equation. The distance the field will penetrate into the infrared active region (i.e., the width of the depletion region) is given by:

$$l \approx \sqrt{\frac{2 \epsilon \epsilon_o}{e N_A} V}$$

$$= 3.5 \times 10^3 \sqrt{\frac{V}{N_A}} \text{ cm}$$

where V is the applied bias and $N_A$ is the acceptor concentration. The above expression assumes that a sufficiently thin blocking layer is present. The width of the depletion region will define the active volume of the device because an appreciable electric field exists only in this region. The bias, for example, required for the field to penetrate 10 $\mu$m in a material with an acceptor concentration of $10^{13}$ cm$^{-3}$ is approximately 1.5 V.

Figure 2:
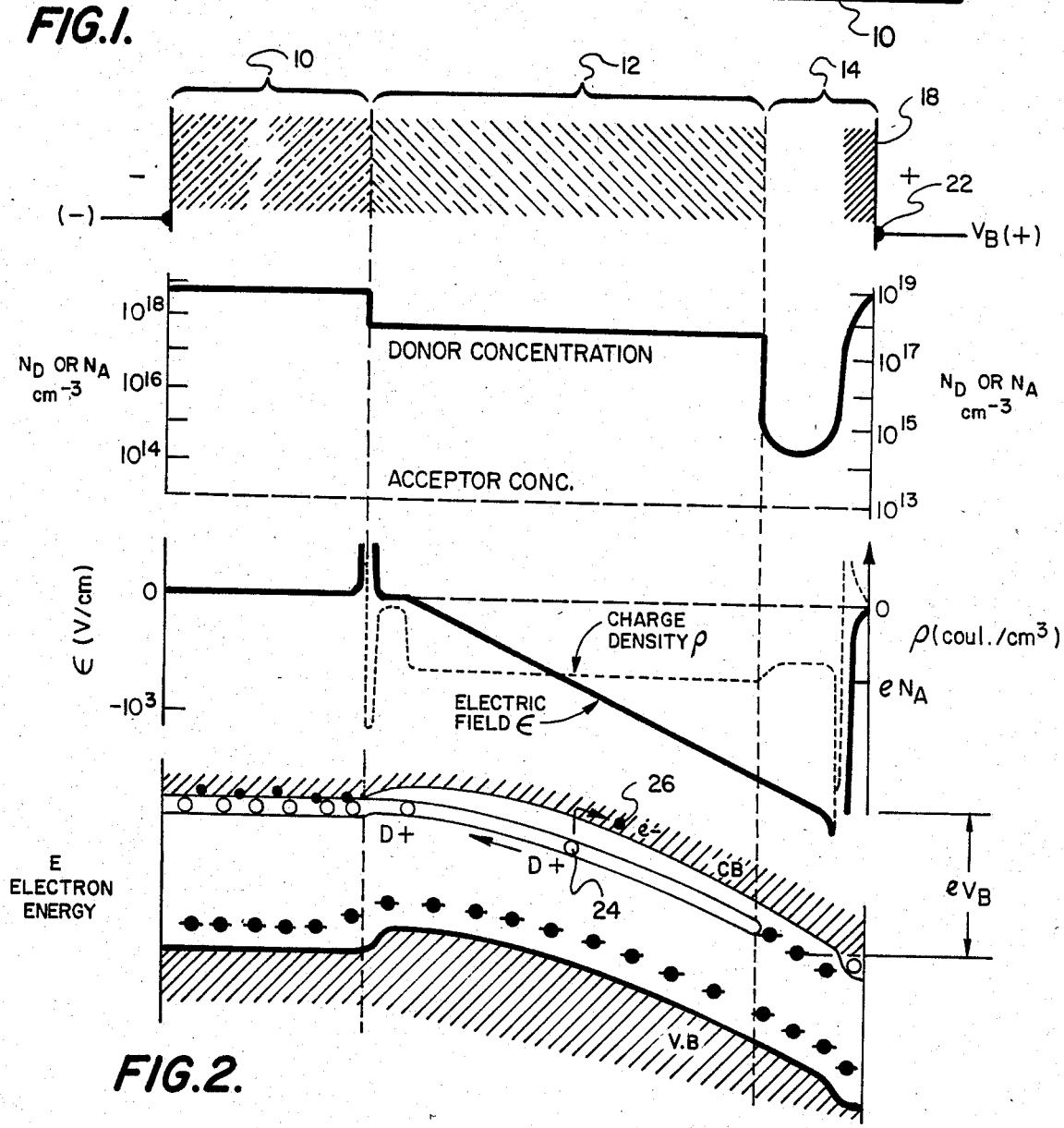
FIG. 2 illustrates the layer configuration, doping profile, electric field, space charge density, and a simplified band diagram for the detector illustrated in FIG. 1.

The detection of infrared photons in the BIB detector of this invention is graphically represented in FIG. 2, which illustrates the layer configuration, doping profile, electric field, space charge density, and a simplified band diagram for the detector shown in FIG. 1. An infrared photon which is absorbed by a neutral donor in the active layer 12 will produce a D+ charge 24 and a conduction band electron 26. Because of the applied electric field, the electron will be swept out through the blocking layer 14 and collected by the transparent electrode 18. The D+ charge 24 will "hop" in the opposite direction because of its positive charge and will be neutralized in the substrate 10 by an electron. Note that because the active layer has been depleted of D+ charges, there are no empty electron states below the conduction band. There are therefore no electron traps and the collection efficiency for the electrons will be very high. Since the conduction band electron concentration is very low, the collection efficiency of D+ charges will likewise be very high. As a result, the detector will exhibit a D.C. photoconductive gain close to unity.

Figure 3:
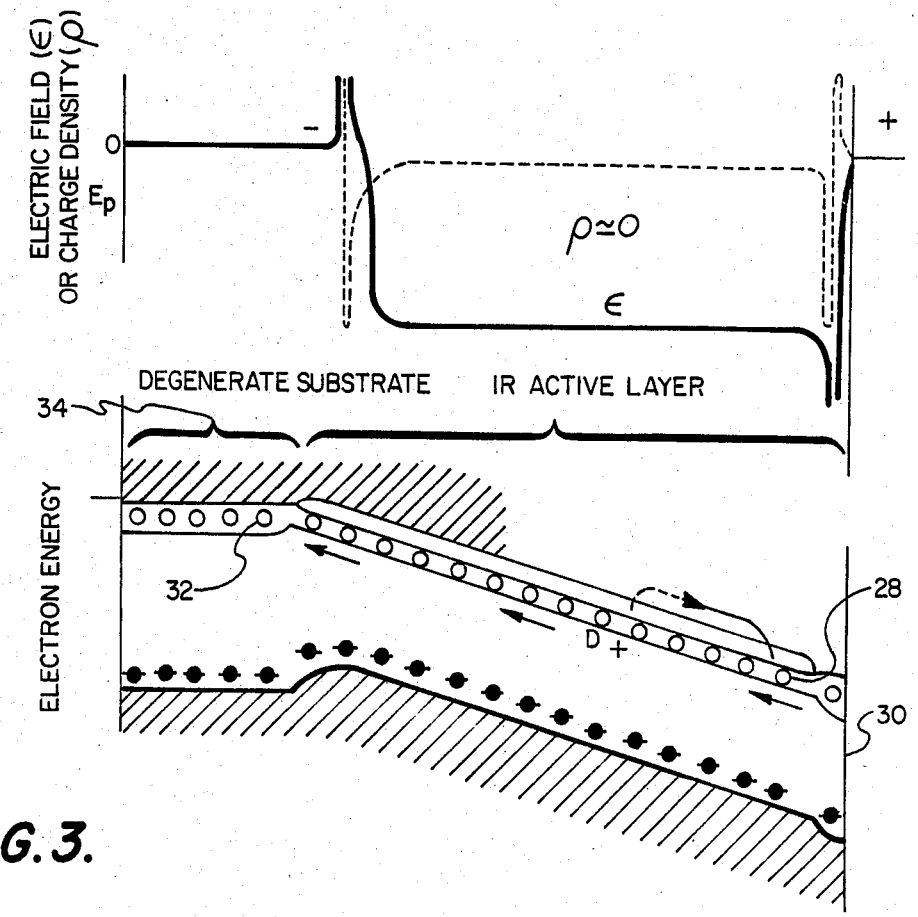
FIG. 3 is a graphical representation showing a simplified band diagram, the electric field, and the charge density distribution for a conventional detector design incorporating a heavily doped layer.

The advantages provided by this invention may be illustrated by comparing it to a model describing the operation of a conventional extrinsic photoconductive detector. FIG. 3 is a graphical representation showing a simplified band diagram, the electric field, and the charge density distribution for a conventional detector design incorporating a heavily doped active layer. Upon the application of a bias potential to the BIB detector, the pre-existing D+ charges are drawn out of the active layer and are not replenished because of the presence of the blocking layer. In the conventional detector, however, as represented in FIG. 3, the D+ charge density cannot be drawn out of the active layer of the detector. A continual injection of new D+ charges 28 from the transparent contact 30, while other D+ charges 32 are swept out to the degenerately doped substrate 34, maintains a constant D+ charge density equal to the acceptor concentration. A dark current in the conventional detector is thus sustained and, because of the associated shot noise, limits the detectivity of the detector. Furthermore, D+ charges are copiously available in the bulk of the detector to capture photogenerated electrons and, because of the high doping concentration, the electron mobility is low. As a consequence of these two effects, such a heavily doped conventional detector will exhibit an undesirably low photoconductive gain.

Figure 4:
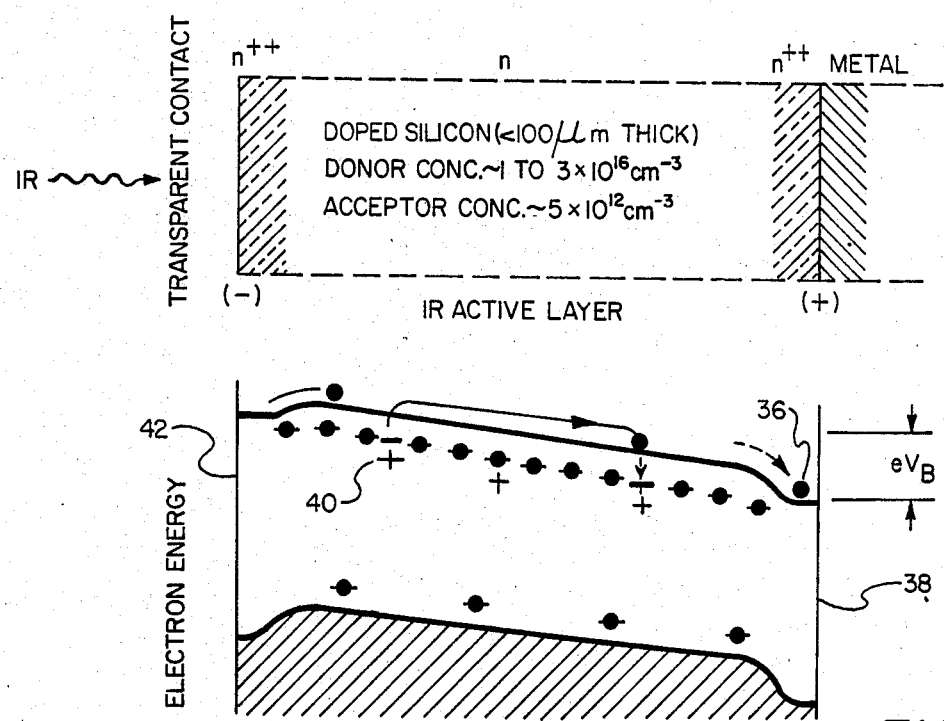
FIG. 4 is a graphical representation of a band diagram for an n-type photoconductor with the relatively low doping levels which are normally utilized in conventional detectors.

In the quest for maximum detectivity, a conventional alternative to the approach shown in FIG. 3 would be to introduce a relatively low donor concentration in the active area to ensure a high mobility-lifetime product (which is directly proportional to the photoconductive gain) and to avoid the dark current which results from impurity banding. With such a relatively low donor concentration the D+ charges will not be mobile. FIG. 4 is a graphical representation of a band diagram for an n-type photoconductor with these relatively low doping levels, which are normally utilized in conventional detectors. Under infrared excitation, donor electrons 36 are excited to the conduction band and are swept out to the positive contact 38, leaving behind fixed D+ charges 40. The buildup of excess D+ charge density is prevented by the injection from the negative contact 42 of electrons, which may then be captured on D+ charges. As a consequence, the collection of the photogenerated electrons can be accompanied by the collection of injected electrons which were not captured on D+ charges. Indeed, when the carrier lifetime is long as compared to the transit time across the detector, only a small fraction of the injected electrons are captured, resulting in a photoconductive gain much greater than unity. This high (DC) photoconductive gain, however, cannot be used to advantage because there is a characteristic time delay (the dielectric relaxation time) between the build-up of D+ charge density and the injection of electrons. Because of this time delay, the injection phenomena will not follow an AC signal and thus at significantly high frequency signals the injected current will not contribute to the AC photoconductive gain. The dielectric relaxation time is also dependent on the infrared background. Under low background conditions, therefore, a conventional extrinsic silicon photoconductor with a low doping level will exhibit a frequency and background dependent gain. Furthermore, other undesirably complex behavior, known as "anomalies", is exhibited by a conventional detector under low background conditions.

The operation of the BIB detector of the present invention, however, does not depend on the injection of electrons from a contact. Furthermore, the build-up of D+ space charge is avoided because in the BIB detector the D+ charges are sufficiently mobile to be collected in times shorter than signal periods of interest, the latter generally being longer than 1 msec.

It is an outstanding feature of this invention to provide a detector which includes an active layer doped to a level more than an order of magnitude higher than has been found practical in a conventional extrinsic photoconductor. This high doping level in turn permits a reduction in thickness of over an order of magnitude without sacrificing the quantum efficiency or responsivity of the detector. The reduction in thickness provides the advantages of increased radiation hardness and substantially reduced cross talk when incorporating the detector of this invention in a monolithic focal plane array.

Figure 5:
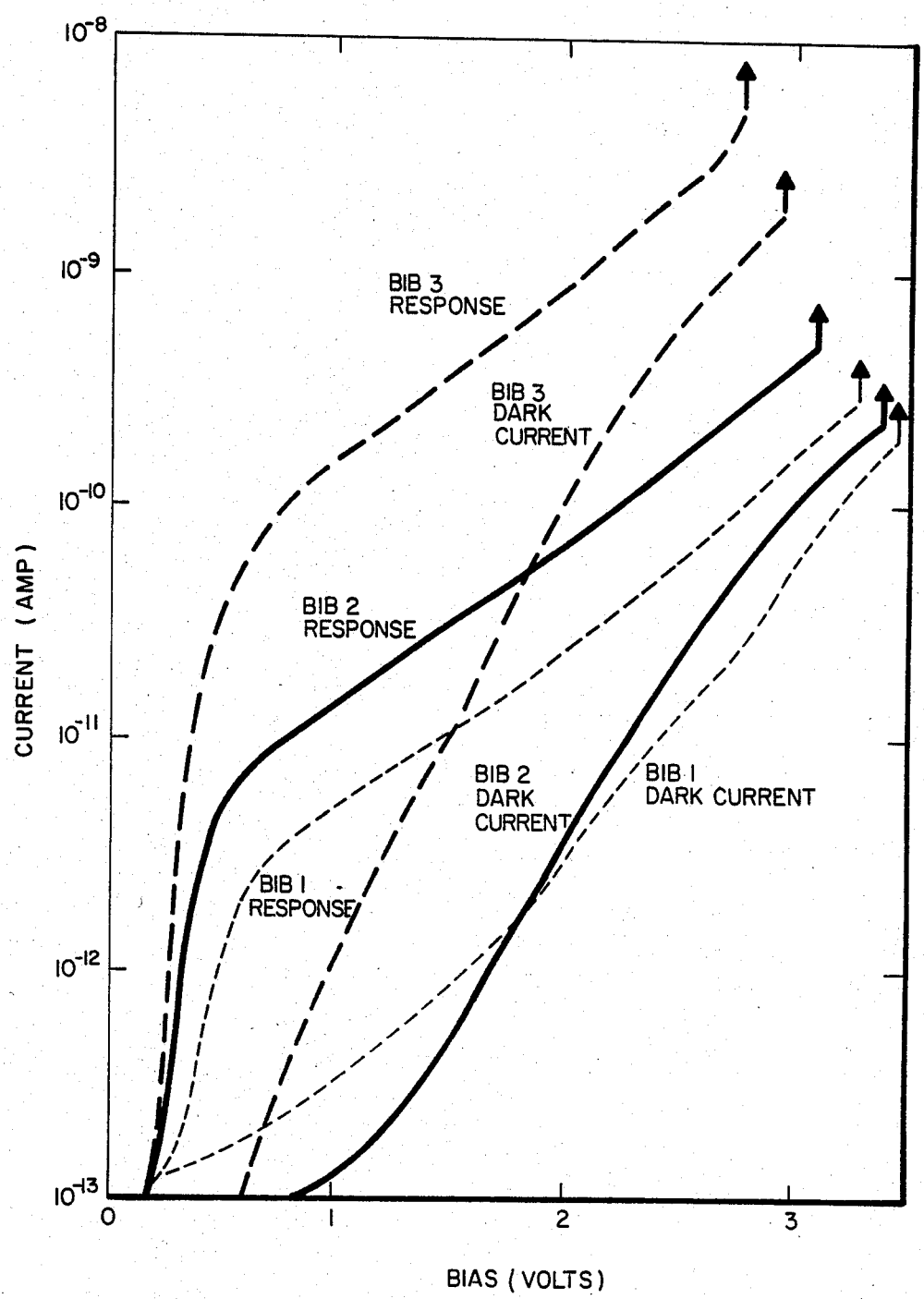
FIG. 5 illustrates the DC photoresponse and dark current of three detectors on a test device, responding to infrared radiation from a 3.2 μm LED.

DC and AC response tests have been performed on a number of detectors constructed in the configuration of FIG. 1 on a test chip. FIG. 5 illustrates the DC photoresponse and dark current exhibited by three detectors on one test chip in responding to 3.2 $\mu$m infrared radiation from a light emitting diode. All three detectors exhibited a good photoresponse to the infrared flux ($\sim 2 \times 10^{13}$ ph/cm$^2$-sec) although the quantum efficiency of the infrared active layer for 3.2 $\mu$m radiation is expected to be approximately 0.05. Furthermore, the response of the detectors was in close proportionality to their area, indicating that the designed active area corresponded to the actual active area and confirming a low level of cross talk between the detectors, since the detectors were thus not collecting charge generated outside their respective active areas.

Figure 6:
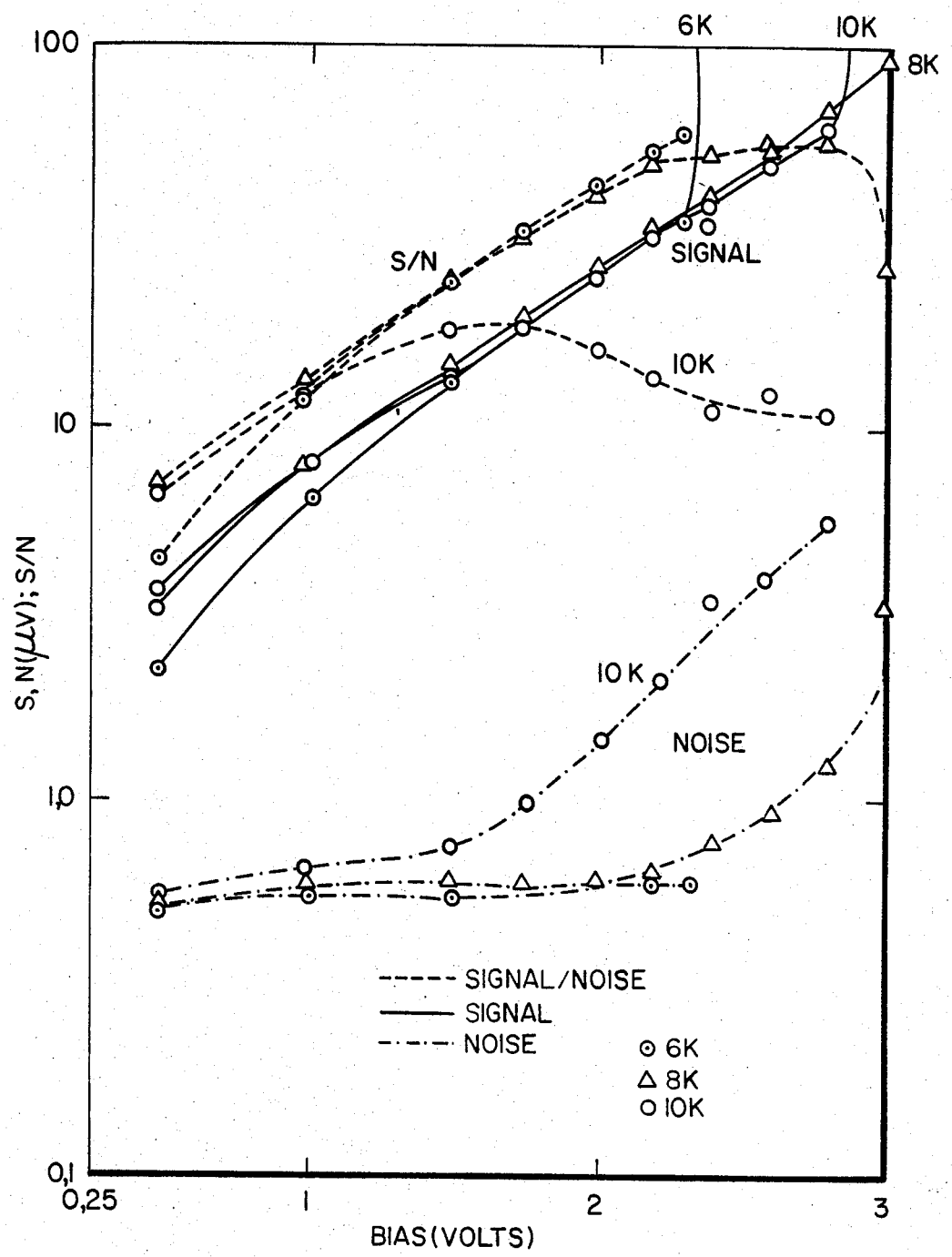
FIG. 6 illustrates the signal, noise, and signal to noise measurements for one test detector at temperatures of 6°, 8°, and 10° K.

FIG. 6 illustrates signal, noise, and signal-to-noise measurements obtained for one test detector at temperatures of 6°, 8°, and 10° K. These measurements were made at a low infrared background level with a 19.1 $\mu$m spike filter. The noise at low bias voltages is MOSFET noise, but at 10° K. for bias levels above 1.5 V is merely the normal shot noise associated with the dark current.

Figure 7:
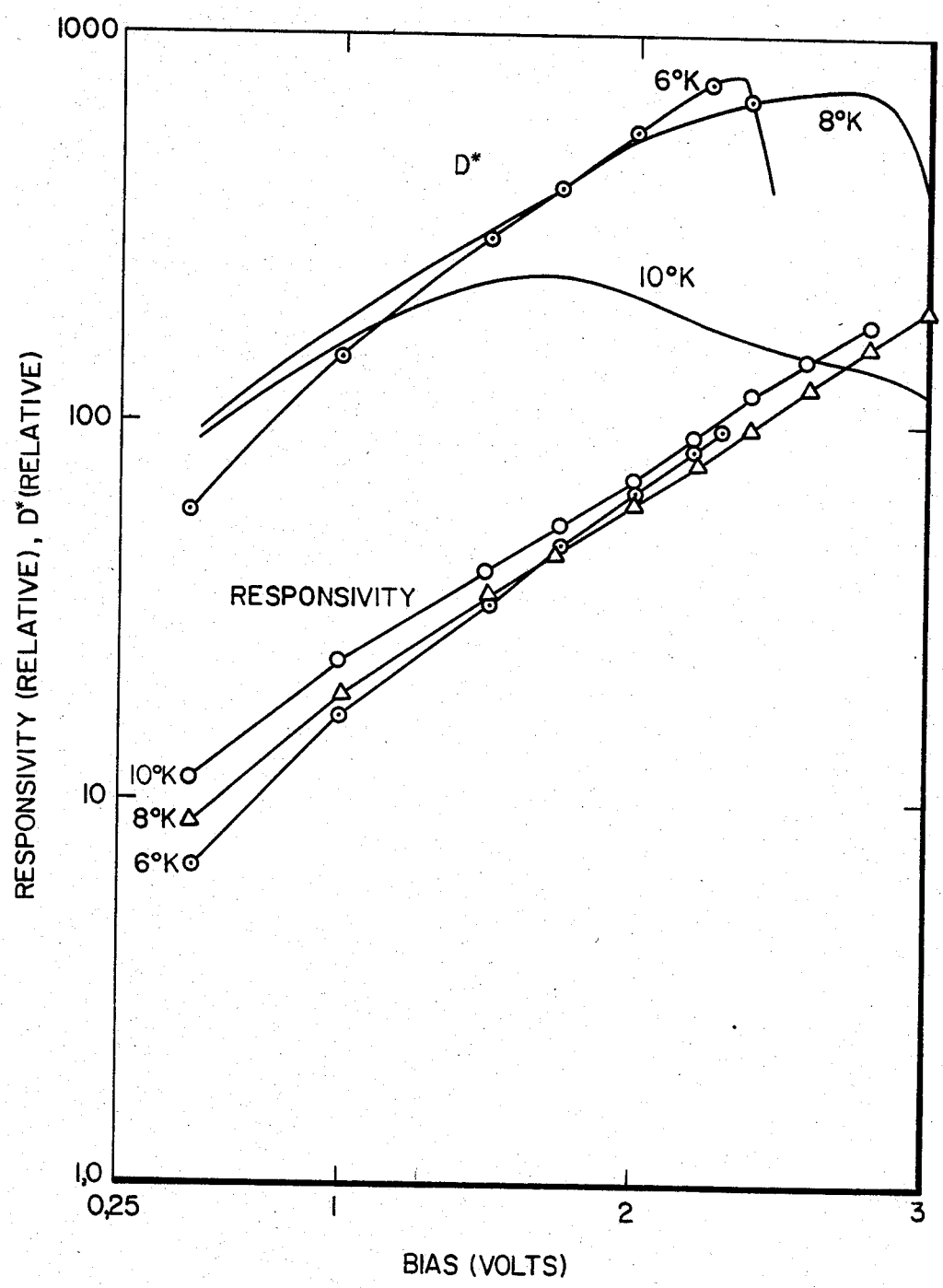
FIG. 7 illustrates the responsivity and D* as functions of the bias voltage for the test detector of FIG. 6.

The data from FIG. 6 was reduced to obtain responsivity and D* as functions of the bias voltage, as shown in FIG. 7. The low background 10 Hz responsivity and D* compare favorably with those of a standard bulk silicon reference detector, which was simultaneously measured to exhibit a responsivity of 7 Amp/watt at a bias of 5 V. This data is consistent with the predicted quantum efficiency at the 19 $\mu$m wavelength and the expected gain close to unity.

Figure 8:
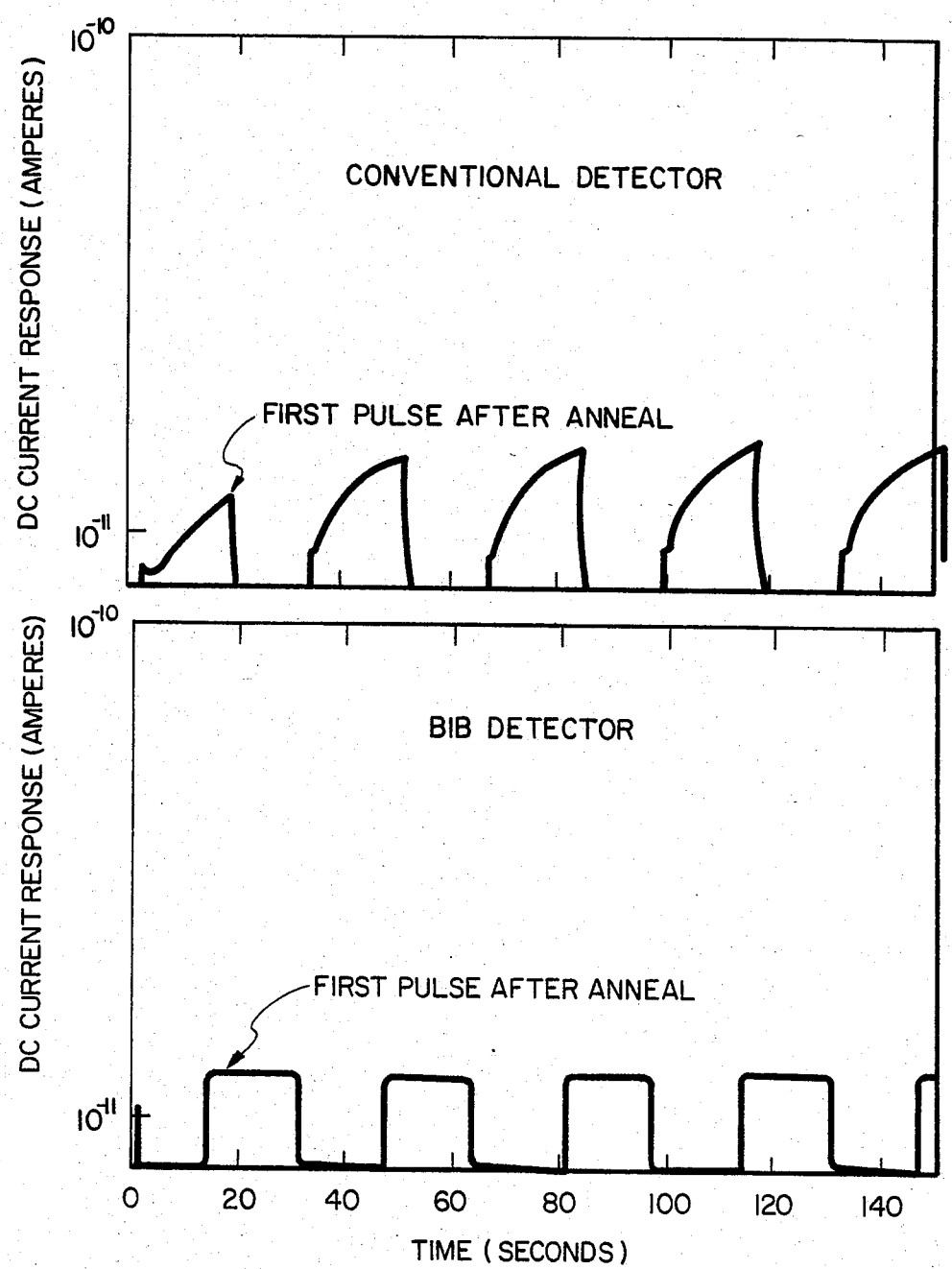
FIG. 8 provides a comparison between the behavior of the conventional detector exposed to a series of long duration infrared pulses as compared to the response of a BIB detector to such pulses.

In FIG. 8, the behavior of a conventional detector when exposed to a series of long duration infrared pulses is compared to the response of a BIB detector exposed to such pulses. The quantum efficiency of the conventional detector was approximately 0.15, with a gain of approximately 3, while the quantum efficiency of the BIB detector was approximately 0.015 with a gain of approximately 1. Data of this type indicates that BIB detectors are at least an order of magnitude less irregular than conventional silicon detectors having the same low background AC responsivity.

Figure 9:
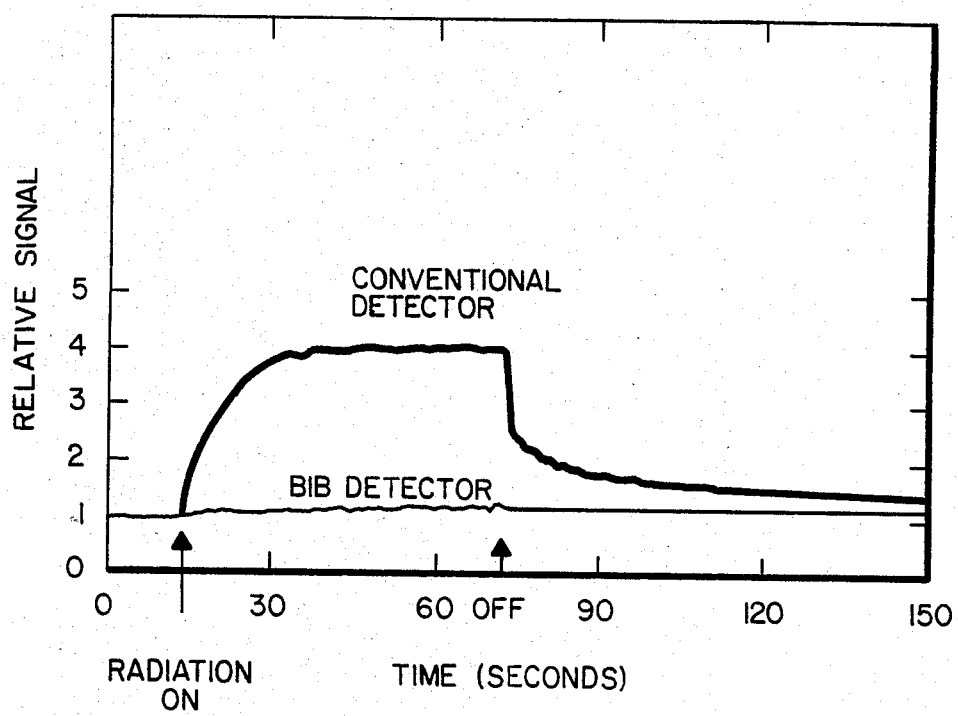
FIG. 9 compares the effect of gamma radiation of a BIB detector and a conventional detector.

FIG. 9 provides a comparison between the effect of gamma radiation on BIB and on conventional detectors. The effects of gamma radiation have been found to be at least an order of magnitude smaller on the BIB detector. With a flux of $10^{10}$ gammas/cm$^2$-sec, the infrared responsivity of the BIB detector biased at 1.5 V stayed within 25% of its pre-radiation value during several minutes over which the signal was monitored.

Figure 10:
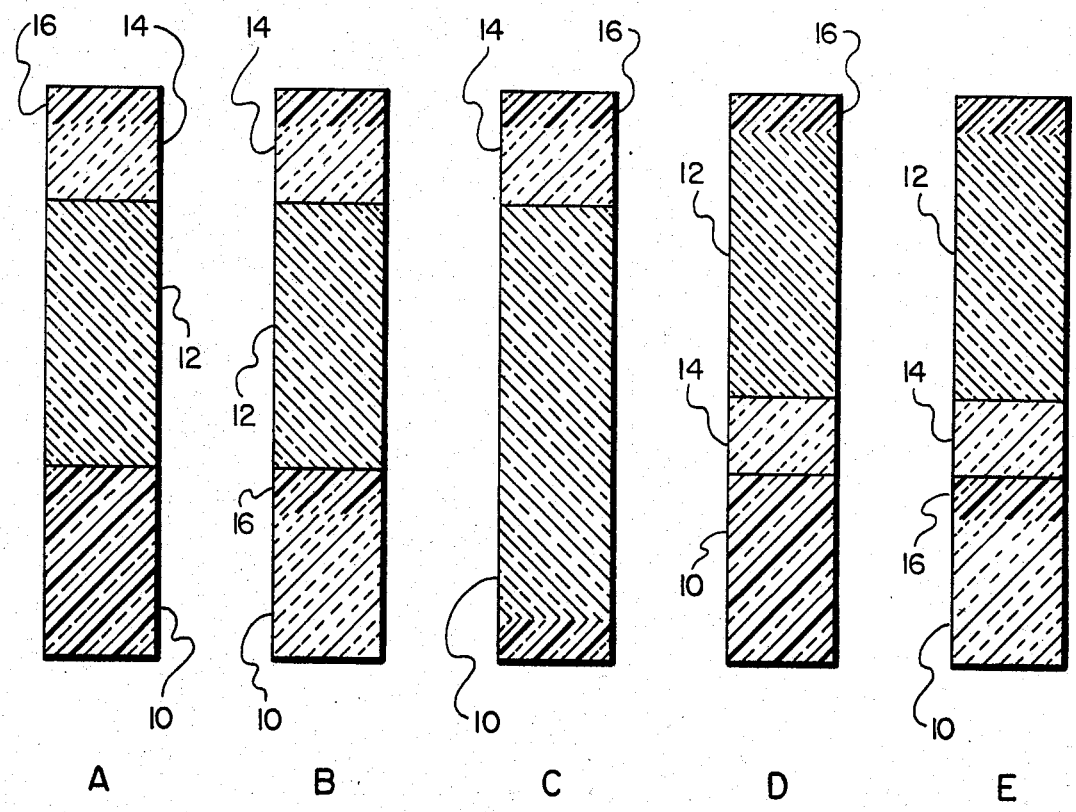
FIG. 10 illustrates, in a cross-sectional view, the layer structure for several different detector designs according to the present invention.

A wide variety of configurations of detectors incorporating the present invention is possible. Five possible layer configurations, for example, are illustrated in FIG. 10 in a cross-sectional view depicting the layer structures for the various detector designs. FIG. 10A is the configuration illustrated in FIG. 1 and discussed above. Here the infrared radiation is incident from the top, passes through the transparent contact 16 and the blocking layer 14, and is absorbed in the infrared active layer 12. The configuration of FIG. 10B is amenable to illumination through the substrate 10. The substrate is undoped so that it is transparent to infrared radiation and a transparent contact 16 is provided between the substrate and the infrared active layer 12. This contact can be fabricated by ion implantation of an appropriate dopant into the substrate surface to a prescribed depth and concentration prior to the growth of the infrared active and blocking layers. The transparent contact may alternatively be formed by epitaxial growth before the infrared active and blocking layers are grown.

The configuration of FIG. 10C does not require a degenerate substrate or implanted bottom contact. Here, a thin blocking layer 14 is grown on a substrate 10, which has a doping concentration appropriate for the infrared active layer, and the detector element is defined by a transparent contact 16 which is implanted into the surface of the blocking layer. The application of a bias voltage (positive for n-type doping) to the contact 16 will create a D+ charge depletion region below the contact in the same manner as described above. At operating temperature, the substrate will be sufficiently conducting that essentially all of the applied bias appears across the depletion region and the active volume of the detector is thus defined by the depletion region.

The "inverted" configurations of FIGS. 10D and E include a blocking layer 14 sandwiched between the substrate 10 and the infrared active layer 12, requiring a negative bias on the upper contact for proper operation with n-type material. The embodiment of FIG. 10D is designed to be illuminated from the top, while that of FIG. 10E may be illuminated through the substrate.

In conclusion, although typical embodiments of the present invention have been illustrated and discussed above, numerous modifications and alternative embodiments of the apparatus and method of this invention will be apparent to those skilled in the art in view of this description. Further modifications of those basic BIB detector configurations are also possible. The embodiments of FIGS. 10B and E, for example, can be illuminated through the substrate and provided with a reflecting top contact. That infrared radiation which is not absorbed in the first pass through the infrared active layer will then be reflected for a second pass through the detector. This modification would allow for even thinner active layers while maintaining the same quantum efficiency. Furthermore, by properly designing the other contact to be semi-reflecting, it is possible to form a resonant structure which will enhance the response at selected wavelengths.

It should also be noted that because the depth of the depletion region in a BIB detector is a function of bias, it is possible to vary the effective thickness of the detector by varying the applied bias. Therefore, the spectral response of a BIB detector will also vary because, in general, the photon absorption coefficient is a strong function of wavelength. This feature will allow operation of a BIB detector as a spectrometer in order to determine a source spectrum. The configuration of FIG. 10C should be particularly useful for this purpose, since in that embodiment the depletion depth is not limited by the thickness of the active layer. Accordingly, this description is to be considered as illustrative only and is provided for the purpose of teaching those skilled in the art the manner of constructing the apparatus and performing the method of this invention. Furthermore, it should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit obtained through reading the above description of the invention.

What is claimed is:

1. A blocked-impurity-band detector, comprising:
   an active layer doped with a sufficient amount of an impurity that charge transport can occur in an impurity band in addition to the charge transport of electrons in the conduction band of said layer or holes in the valence band of said layer;
   an impurity band blocking layer disposed on said active layer and containing a sufficiently low concentration of impurities that significant charge transport cannot occur in said layer except by means of electrons in the conduction band of said layer or holes in the valence band of said layer; and
   first and second electrodes for applying a bias potential across said layers.

2. The detector of claim 1, wherein said blocking layer is an intrinsic, undoped layer.

3. The detector of claim 2, wherein said blocking layer further comprises an epitaxial layer grown on said active layer.

4. The detector of claim 3, wherein said active layer and said blocking layer comprise silicon layers.

5. The detector of claim 4, wherein said active layer is responsive to light in the infrared portion of the spectrum.

6. The detector of claim 1, wherein said active layer is doped with a donor impurity so that said layer exhibits an n-type conductivity.

7. The detector of claim 1, wherein said active layer is doped with an acceptor impurity so that said layer exhibits a p-type conductivity.

8. The detector of claim 1, wherein said first electrode is a transparent electrode implanted into said blocking layer.

9. The detector of claim 8, wherein said first electrode further comprises:
   a doped first region of a first conductivity type implanted in a thinned area of said blocking layer; and
   a relatively heavily doped second region of said first conductivity type implanted in said blocking layer adjacent said thinned area and contacting said first region.

10. A blocked-impurity-band detector, comprising:
    a relatively heavily doped active layer of a first conductivity type;
    an intrinsic, undoped impurity band blocking layer epitaxially grown on said active layer; and
    first and second electrodes for applying a bias potential across said layers.

11. A blocked-impurity-band detector, comprising:
    a degenerately doped substrate of a first conductivity type;
    a relatively heavily doped active layer of said first conductivity type disposed on said substrate;
    an impurity band blocking layer, no more than lightly doped, disposed on said active layer; and a transparent electrode implanted into said blocking layer for applying, in conjunction with said substrate, a bias potential across said layers.

12. A blocked-impurity-band detector, comprising:
a substrate, no more than lightly doped;
a relatively heavily doped active layer of a first conductivity type disposed on said substrate;
a transparent first electrode disposed between said substrate and said active layer;
an impurity band blocking layer, no more than lightly doped, disposed on said active layer; and
a second electrode implanted into said blocking layer.

13. The detector of claim 12, further comprising a reflecting layer disposed on said blocking layer.

14. The detector of claim 13, further comprising a semireflecting layer disposed on said substrate.

15. A blocked-impurity-band detector, comprising:
a relatively heavily doped active layer of a first conductivity type;
a first electrode implanted into said active layer;
an impurity band blocking layer, no more than lightly doped, disposed on said active layer opposite said first electrode; and
a transparent second electrode implanted into said blocking layer.

16. A blocked-impurity-band detector comprising:
a degenerately doped substrate of a first conductivity type;
an impurity band blocking layer, no more than lightly doped, disposed on said substrate;
a relatively heavily doped active layer of said first conductivity type disposed on said blocking layer; and
a transparent electrode implanted into said active layer for applying, in conjunction with said substrate, a bias potential across said layers.

17. A blocked-impurity-band detector, comprising:
a substrate, no more than lightly doped;
an impurity band blocking layer, no more than lightly doped, disposed on said substrate;
a transparent first electrode disposed between said substrate and said blocking layer;
a relatively heavily doped active layer of a first conductivity type; and
a second electrode implanted into said active layer.

18. The detector of claim 17, further comprising a reflecting layer disposed on said active layer.

19. The detector of claim 18, further comprising a semireflecting layer disposed on said blocking layer.

20. An improved photodetector of the type including a doped active layer of a first conductivity type and a pair of electrodes for applying a bias potential across the detector, the improvement comprising:
an impurity band blocking layer, no more than lightly doped, disposed on said active layer for inhibiting the movement of charge carriers in an impurity band.

21. The photodetector of claim 20, wherein said blocking layer further comprises an intrinsic undoped layer.

22. The photodetector of claim 21, wherein said active and blocking layers comprise silicon layers.

23. The photodetector of claim 22, wherein said active layer is responsive to light in the infrared portion of the spectrum.

24. A method of making a blocked-impurity-band detector, comprising the steps of:
(a) providing a degenerately doped substrate of a first conductivity type;
(b) epitaxially growing a thin active layer on the substrate;
(c) relatively heavily doping the active layer to the first conductivity type;
(d) epitaxially growing a thin intrinsic impurity band blocking layer on the active layer; and
(e) implanting a transparent electrode in the blocking layer.

25. The method of claim 24, wherein step (e) further comprises:
thinning the blocking layer in a region;
doping the thinned region with an ion implantation of the first conductivity type; and
heavily doping a contact region in the blocking layer and adjacent to the thinned region with an ion implantation of the first conductivity type.

* * * * *